(12) United States Patent
Hembree

(10) Patent No.: US 6,229,322 B1
(45) Date of Patent: May 8, 2001

(54) ELECTRONIC DEVICE WORKPIECE PROCESSING APPARATUS AND METHOD OF COMMUNICATING SIGNALS WITHIN AN ELECTRONIC DEVICE WORKPIECE PROCESSING APPARATUS

(75) Inventor: David R. Hembree, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/137,629

(22) Filed: Aug. 21, 1998

(51) Int. Cl.[7] .................................................. G01R 31/00
(52) U.S. Cl. ............................................ 324/755; 324/760
(58) Field of Search .................................... 324/754, 755, 324/760, 765; 438/14, 17; 257/498; 439/66–72

(56) References Cited

U.S. PATENT DOCUMENTS

| | | | | |
|---|---|---|---|---|
| 4,560,216 | * | 12/1985 | Egawa ................................... | 324/754 |
| 4,754,555 | * | 7/1988 | Stillman ................................ | 33/552 |
| 5,325,052 | * | 6/1994 | Yamashita ............................. | 324/760 |
| 5,475,317 | * | 12/1995 | Smith .................................... | 324/760 |
| 5,495,667 | | 3/1996 | Farnworth et al. ..................... | 29/843 |

OTHER PUBLICATIONS

Advertisement for Probe Technology from the Web Page of Interconnect Devices, Inc.,; Mar. 6, 1998, 1 page.
Good Things Come In Small BGA/CSP Packages from the Web Page of Johnstech International, Corporation.; Mar. 6, 1998, 1 page.
Product Description for Test Socket Contacts from the Web Page of Johnstech International, Corporation,; Mar. 5, 1998, 1 page.
Product Description for Double Ended Probes, B1052 Series, from the Web Page of Rika Denshi america, Inc.,; Feb. 4, 1998, 1 page.
Product Description for Test Centers, RM–500 Series Probes, from the Web Page of Rika Denshi America,Inc.; Feb. 4, 1998, 1 page.
Product Description for Cost Effective Interconnections for High I/O Products from the Web Page of Rika Denshi America, Inc.; Feb, 4, 1998, 1 page.
Product Description for Ball Grid Probe B1303–C3 from the Web Page of Rika Denshi America, Inc.,; Feb. 4, 1998, 1 page.

* cited by examiner

Primary Examiner—Vinh P. Nguyen
(74) Attorney, Agent, or Firm—Wells, St. John, Roberts, Gregory & Matkin, P.S.

(57) ABSTRACT

The present invention includes an electronic device workpiece processing apparatus and method of communicating signals within an electronic device workpiece processing apparatus. One embodiment of an electronic device workpiece processing apparatus includes a chuck including a surface, an electrical coupling adjacent the surface, and electrical interconnect configured to connect with the electrical coupling of the chuck and conduct a signal within the chuck; an intermediate member having a first surface and a second surface and the intermediate member including: an electrical coupling adjacent the first surface and configured to couple with the electrical coupling of the chuck; an electrical coupling adjacent the second surface; and an electrical interconnect configured to connect the electrical coupling adjacent the first surface and the electrical coupling adjacent the second surface; and an electronic device workpiece configured to couple with the second surface of the intermediate member, the electronic device workpiece including a sensor and an electrical coupling configured to provide electrical connection of the sensor with the electrical coupling of the second surface of the intermediate member.

11 Claims, 6 Drawing Sheets

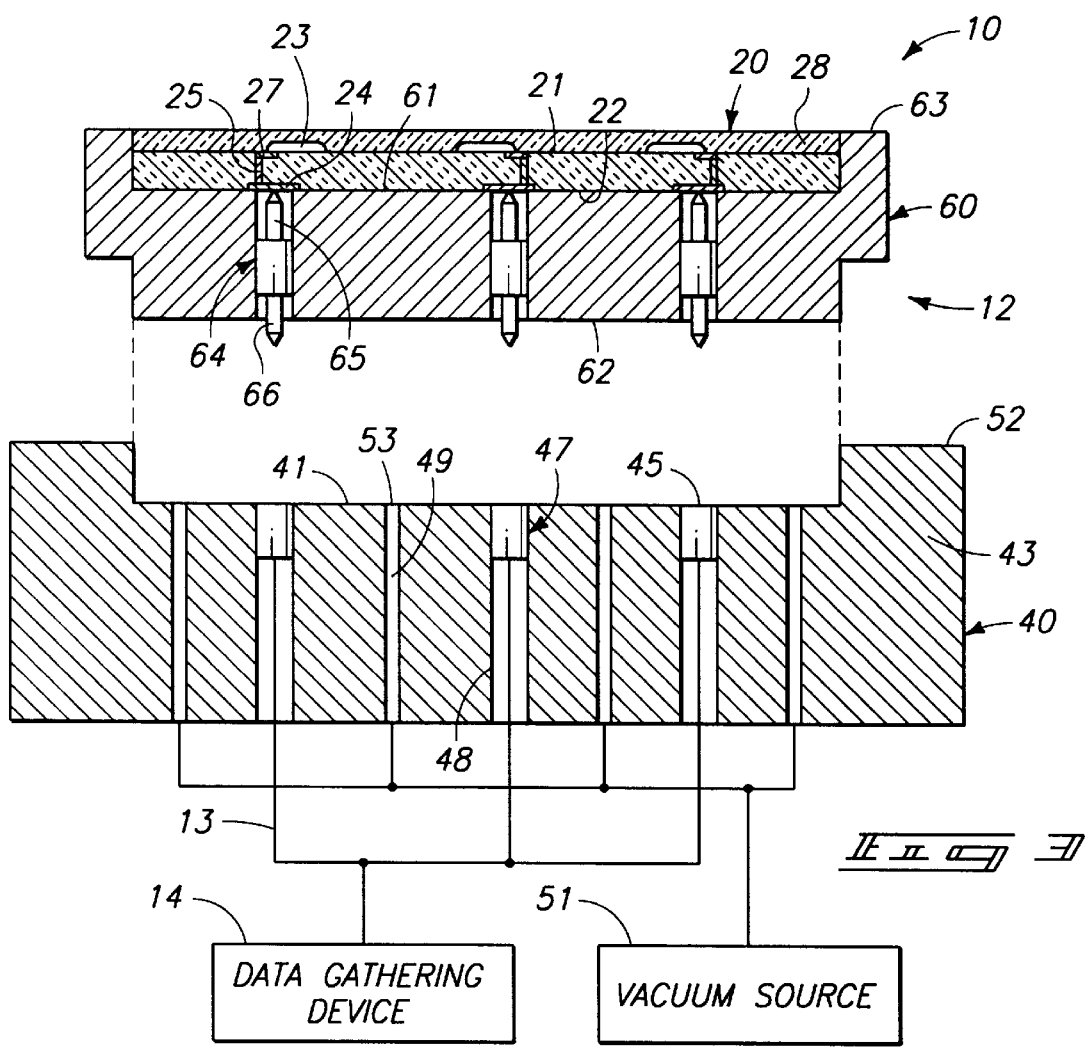
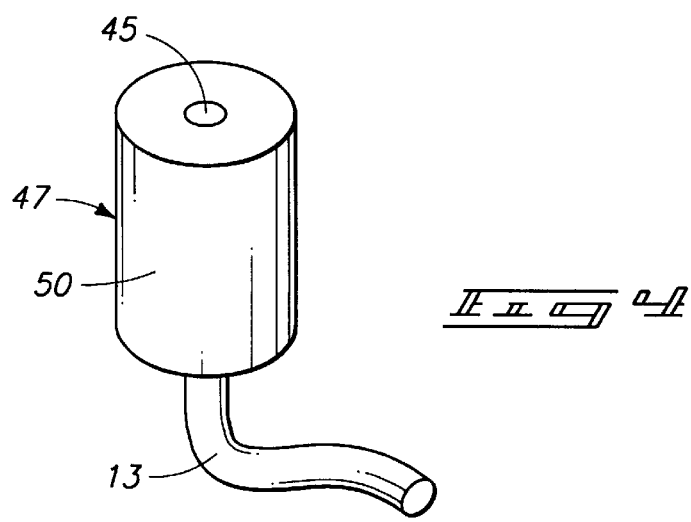

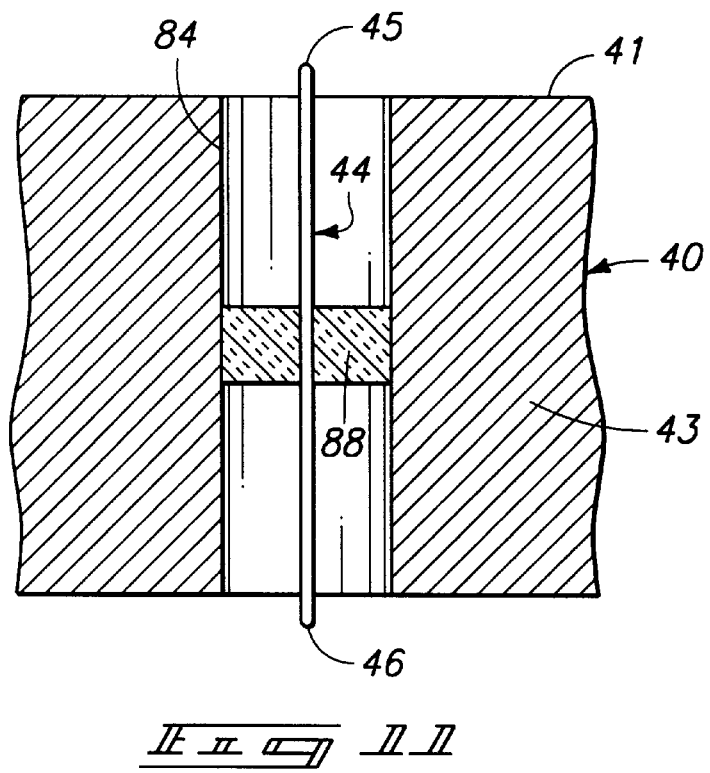
_FIG. 11_
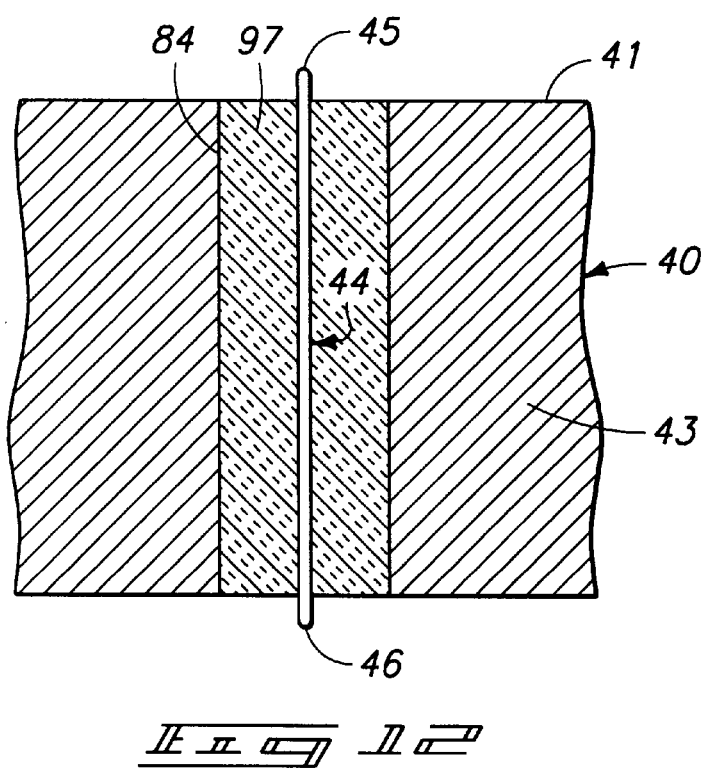
_FIG. 12_

US 6,229,322 B1

ELECTRONIC DEVICE WORKPIECE PROCESSING APPARATUS AND METHOD OF COMMUNICATING SIGNALS WITHIN AN ELECTRONIC DEVICE WORKPIECE PROCESSING APPARATUS

TECHNICAL FIELD

The present invention relates to an electronic device workpiece processing apparatus and method of communicating signals within an electronic device workpiece processing apparatus.

BACKGROUND OF THE INVENTION

It is preferred in the semiconductor and related arts to utilize large wafers for fabrication of integrated circuits and other devices. Large wafers are preferred inasmuch as an increased number of chips can be fabricated from larger workpieces. As the size of the wafers continues to increase as processing techniques are improved, additional processing obstacles are presented.

For example, it is typically preferred to provide a substantially uniform temperature across the surface of wafers being processed because changes in temperature can influence device fabrication. Wafers of increased diameters and surface areas experience increased temperature fluctuations at various locations on the workpiece. In particular, a partial vacuum is typically used to pull small diameter wafers into direct thermal contact with a hot plate. Such processing methods facilitate substrate temperature control because the substrate temperature is closely associated to the temperature of the hot plate. Fabrication of small sub-micron devices upon larger diameter semiconductor wafers or workpieces requires minimal backside contamination. As such, contact of the workpiece with the hot plate is not typically possible. Large workpieces are processed in conventional operations upon spacers or pins that position the workpiece approximately 0.1 millimeters above the hot plate surface. Such spacing intermediate a chuck or hot plate and the workpiece can result in temperature fluctuations across the surface of the workpiece.

The utilization of specific materials for processing large workpieces in small geometry applications presents numerous obstacles. Absolute workpiece temperature and workpiece temperature uniformity are parameters which are closely monitored during wafer and workpiece fabrication to provide critical dimension (CD) control. Chemically amplified resists are often utilized in deep ultraviolet (DUV) lithography in small micron geometries (eg., 0.25 microns and below). Chemically amplified resists are particularly temperature dependent further increasing the importance of temperature control and monitoring. Some thermal resist processing steps require process windows ranging from 1–2 degrees centigrade down to a few tenths of a degree centigrade. Meteorology that is four to ten times more precise than conventional process equipment is typically utilized to provide thermal performance measurements to 0.1 degrees centigrade.

One approach has disclosed the use of temperature sensors across a surface of the wafer to provide temperature mapping of the workpiece during processing. Platinum foil and copper leads are utilized to electrically connect the temperature sensors. With the use of numerous temperature sensors across an entire workpiece surface, numerous wires are required for coupling and monitoring. Such numerous wired connections can break and/or adversely impact processing of the workpiece or the temperature measurements taken of the surface of the workpiece. Some temperature sensors require four leads per sensor further impacting the processing and temperature monitoring of the workpieces.

An improved method of providing temperature information is disclosed in U.S. patent application Ser. No. 09/032,184, entitled "Electronic Device Workpieces, Methods of Semiconductor Processing and Methods of Sensing Temperature of an Electronic Device Workpiece", filed Feb. 27, 1998, naming Dr. Salman Akram and David R. Hembree as inventors, assigned to the assignee hereof, and incorporated herein by reference.

There exists a need to provide additional improvements for monitoring of processing of workpieces.

SUMMARY OF THE INVENTION

The invention provides electronic device workpiece processing apparatuses, and methods of communicating signals within an electronic device workpiece processing apparatus. Exemplary electronic device workpieces include production workpieces (e.g., silicon wafers) and calibration wafers.

One aspect of the invention provides an electronic device workpiece processing apparatus including a chuck, intermediate member and an electronic device workpiece. The chuck includes an electrical interconnect configured to conduct signals within the chuck. The intermediate member is configured to conduct signals intermediate opposing surfaces of the intermediate member. The electronic device workpiece includes one or more sensors. An exemplary sensor comprises a resistance temperature device (RTD) configured to provide process signals containing process information regarding the electronic device workpiece processing apparatus. A data gathering device or recorder can be provided to record process information generated by the electronic device workpiece processing apparatus. The chuck and intermediate member are configured to communicate the process signals intermediate the sensor and the data gathering device.

According to another aspect of the invention, an electronic device workpiece processing apparatus includes a workpiece holder. Exemplary workpiece holders include a chuck and an intermediate member. The workpiece holder is adapted to receive an electronic device workpiece and includes an electrical coupling configured to electrically couple with an electrical coupling of a received electronic device workpiece. The workpiece holder is adapted for communication of signals between the electronic device workpiece and the workpiece holder.

The present invention also provides methods of communicating signals within an electronic device workpiece processing apparatus. According to one method, a workpiece holder is coupled with an electronic device workpiece and a signal can be communicated through the workpiece holder. The communicated signals preferably contain process information.

Another aspect of the invention provides a method comprising electrically coupling a sensor of an electronic device workpiece with a workpiece holder configured to receive the workpiece. The workpiece holder is configured to communicate signals generated using the sensor.

Yet another aspect of the present invention provides a method comprising communicating signals intermediate circuitry of an electronic device workpiece and circuitry of a workpiece holder configured to receive the electronic device workpiece.

BRIEF DESCRIPTION OF THE DRAWINGS

Preferred embodiments of the invention are described below with reference to the following accompanying drawings.

FIG. 3 is a cross-sectional view of another embodiment of an electronic device workpiece processing apparatus.

FIG. 4 is an isometric view of a pogo plug of the chuck depicted in FIG. 3.

FIG. 10 is a cross-sectional view of the electrical interconnect of

FIG. 9 coupled with a calibration workpiece.

FIG. 11 is a cross-sectional view of another embodiment of an electrical interconnect of a chuck.

FIG. 12 is a cross-sectional view of yet another embodiment of an electrical interconnect of a chuck.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
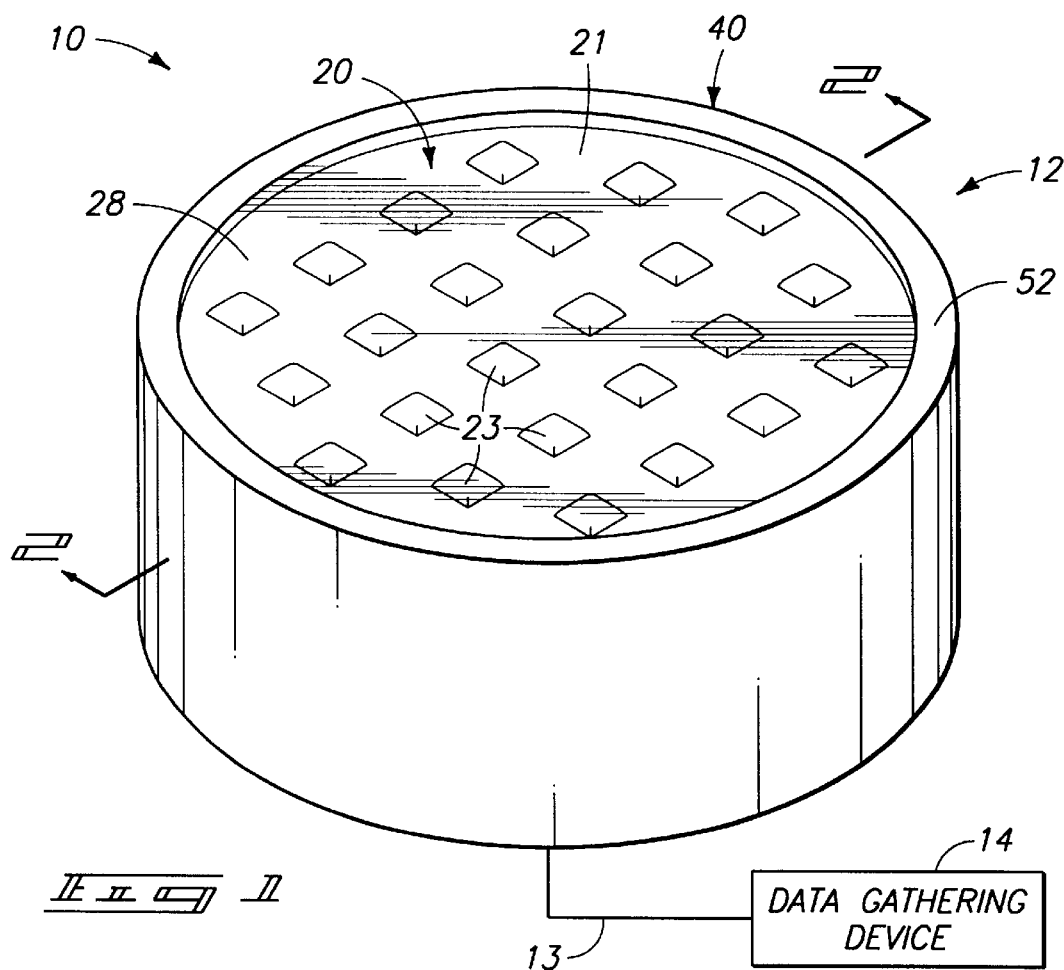
FIG. 1 is an isometric view illustrating one embodiment of an electronic device workpiece processing apparatus.

Referring to FIG. 1, an embodiment of an electronic device workpiece processing apparatus 10 is illustrated. The depicted apparatus 10 includes a workpiece holder 12 adapted to couple with or receive an electronic device workpiece 20. Exemplary workpiece holders 12 include a chuck 40 as shown in FIG. 1 and an intermediate member described below. Exemplary electronic device workpieces include calibration workpieces and production workpieces.

Workpiece holder 12 includes an electrical coupling (not illustrated in FIG. 1) configured to electrically connect with an electrical coupling of electronic device workpiece 20. Connection of circuitry including electrical couplings of electronic device workpiece 20 and workpiece holder 12 permits communication of signals between electronic device workpiece 20 and workpiece holder 12. Workpiece holder 12 is configured to receive and conduct or communicate signals.

Electronic device workpiece 20 comprises a calibration workpiece in the presently described embodiment. Production workpieces typically undergo processing from which subsequent devices are formed. Exemplary production electronic device workpieces include semiconductor wafers, glass or quartz substrates for flat panel or field emission display devices, etc. Typical production workpieces are processed and subsequently utilized to form products used in a variety of electronic devices. Calibration and production electronic device workpieces can comprise silicon, glass, quartz or other materials.

Workpiece holder 12 can be implemented in various configurations. In the embodiment depicted in FIG. 1, workpiece holder 12 is implemented as a chuck 40. Chuck 40 is configured to receive electronic device workpiece 20 and preferably compatible with processing of electronic device workpiece 20.

In the depicted embodiment, electronic device workpiece 20 comprises a calibration workpiece. Workpiece 20 includes opposing surfaces 21, 22 (only surface 21 is shown in FIG. 1). A plurality of sensors 23 are borne by or provided adjacent first surface 21 of workpiece 20. Sensors 23 are configured to sense a process condition within apparatus 10 and generate and output process signals corresponding to the sensing. Exemplary process signals contain information regarding processing of a workpiece.

The depicted sensors 23 comprise resistance temperature devices (RTD). The information within the process signals can comprise temperature information corresponding to sensed temperatures at plural positions across surface 21 of workpiece 20.

In a preferred embodiment, sensors 23 comprising resistance temperature devices individually include plural electrical connections. Such resistance temperature devices include four electrical connections providing two connections for voltage monitoring and two connections for current monitoring. This configuration provides cancellation or minimization of wire resistances of connections to sensors 23.

In the embodiment depicted in FIG. 1, chuck 40 is coupled with a data gathering device or data recorder 14. Data gathering device 14 is configured to couple with an electrical interconnect of chuck 40 and receive process signals through chuck 40 outputted from plural sensors 23 provided upon workpiece 20. One embodiment of data gathering device 14 comprises a ClientPro MTR computer available from Micron Electronics, Inc. utilizing a Pentium™ processor.

Data gathering device 14 is configured to receive and process signals provided by sensors 23 and corresponding to processing conditions of workpiece 21. Alterations to processing conditions of apparatus 10 can be changed responsive to reception of process signals within device 14.

Electronic device workpiece 20 is held by chuck 40 with the use of a vacuum or mechanical coupling in exemplary embodiments. The depicted chuck 40 includes a lip 52 configured to receive and maintain electronic workpiece device 20 in a desired position relative to chuck 40.

Figure 2:
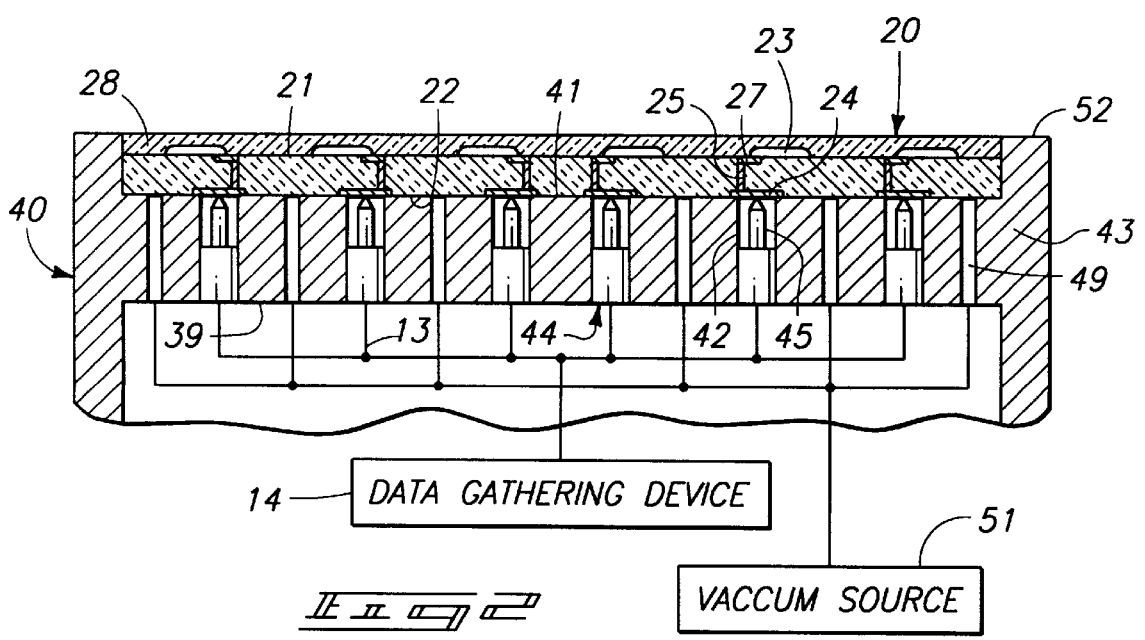
FIG. 2 is a cross-sectional view taken along line 2—2 of the electronic device workpiece processing apparatus of FIG. 1.

Referring to FIG. 2, the depicted chuck 40 includes a surface 39 and an opposing surface 41. Chuck 40 also includes circuitry comprising a plurality of electrical interconnects 44 and plural electrical couplings 45 adjacent surface 41. Electrical interconnects 44 are configured to connect with or include respective electrical couplings 45 of chuck 40. In addition, electrical interconnects 44 are configured to conduct or communicate signals within and through chuck 40. In the depicted embodiment, electrical interconnects 44 are configured to conduct or communicate signals intermediate surfaces 39, 41 of chuck 40.

The depicted electrical interconnects 44 comprise pogo pins which are available from Rika Denshi America, Inc. and have product designation RM-500 Series. Electrical interconnects 44 of other configurations can be utilized.

Calibration workpiece 20 is shown received within chuck 40 in FIG. 2. Lip 52 is operable to define a compartment for reception of electronic device workpiece 20. Surfaces 21, 22 of electronic device workpiece 20 are illustrated in FIG. 2. A plurality of sensors 23, such as resistance temperature devices, are shown provided or fabricated upon surface 21 of electronic device workpiece 20. In the depicted embodiment, an insulative protective layer 28 is shown formed over sensors 23. Layer 28 can comprise glass or other suitable material for protecting sensors 23.

One exemplary electronic device workpiece 20 is described in the patent application having Ser. No. 09/032,184, filed Feb. 27, 1998, and cited above. Such a workpiece 20 includes circuitry comprising electrical couplings 24, vias 25 and connections 27 corresponding to respective sensors 23.

Connections 27 comprise conductive traces in the described embodiment and are configured to couple sensors 23 with respective vias 25. Vias 25 extend intermediate surfaces 21, 22 of electronic device workpiece 20. Vias 25 preferably include a conductive material to electrically couple surfaces 21, 22 of workpiece 20. In a preferred embodiment, the conductive material in vias 25 is electrically isolated from electronic workpiece 20. For example, an insulator or dielectric layer around the via conductor can be utilized.

Electrical couplings 24 are adjacent or borne by surface 22 of electronic device workpiece 20. Electrical couplings 24 comprise bond or land pads of electronic device workpiece 20 and correspond to respective sensors 23 and vias 25. Further, electrical couplings 24 are preferably configured to provide electrical connection of sensors 23 with electrical couplings of chuck 40 and an intermediate member (if provided) as described below.

Electrical couplings 45 are spring loaded and configured to protrude slightly above surface 41 of chuck 40. Electrical couplings 45 of chuck 40 are configured or adapted to couple with electrical couplings 24 of electronic device workpiece 20. Positioning or reception of electronic device workpiece 20 upon chuck 40 slightly depresses electrical couplings 45 of pogo pins or electrical interconnects 44 in the described embodiment. Electrical connection is established intermediate electrical couplings 24 of device 20 and electrical couplings 45 of chuck 40.

Following connection of electrical couplings 24, 45, process signals from data gathering device 14 can be applied to sensors 23 via wire 13, electrical interconnect 44, electrical couplings 24, 45 and connections 25, 27. In addition, signals outputted from sensors 23 can be conducted via connections 25, 27, electrical couplings 24, 45, electrical interconnect 44, and wire 13 to data gathering device 14. The depicted pogo pins are configured to remain within chuck 40 during normal production use or processing of production electronic device workpieces in one embodiment of the invention.

Workpiece holder 12, as depicted in FIG. 2, includes a plurality of vacuum channels or chambers 49 extending intermediate surfaces 39, 41. Vacuum chambers 49 are coupled with a vacuum source 51 in a preferred embodiment. Vacuum chambers 49 are configured to receive a vacuum to couple a received electronic device workpiece 20 with workpiece holder 12. Mechanical devices such as clamps are utilized in other embodiments to attach or couple workpiece 20 with workpiece holder 12.

Following coupling of the circuitry of calibration workpiece 20 with the circuitry of workpiece holder 12, process signals can be communicated intermediate sensors 23 and data gathering device 14. Thereafter, the coupling of respective circuitry of workpiece 20 and workpiece holder 12 can be broken and another calibration workpiece or production workpiece can be coupled with workpiece holder 12.

Referring to FIG. 3, an alternative embodiment of electronic device workpiece processing apparatus 10 is illustrated. The depicted processing apparatus 10 includes a workpiece holder 12 comprising an insert or intermediate member 60. Intermediate member 60 is also referred to as an insert or interposer. The depicted intermediate member 60 is adapted to couple with chuck 40, and receive and couple with electronic device workpiece 20. Intermediate member 60 is preferably configured to communicate signals intermediate chuck 40 and electronic device workpiece 20.

Intermediate member 60 preferably comprises a nonconductive material which is compatible with a fabrication environment. Intermediate member 60 includes opposing surfaces 61, 62 and circuitry comprising at least one electrical interconnect 64 and plural electrical couplings 65, 66. Electrical interconnect 64 is configured to electrically couple opposing surfaces 61, 62 of intermediate member 60. In addition, electrical interconnect 64 is configured to couple circuitry of workpiece 20 and circuitry of chuck 40. Surface 61 of intermediate member 60 is configured to face a received electronic device workpiece 20. Surface 62 of intermediate member 60 is configured to face chuck 40 during processing of electronic device workpieces 20.

Intermediate member 60 is configured to receive electronic device workpiece 20 having electrical couplings 24. In addition, intermediate member 60 is configured to couple with chuck 40 having electrical couplings 45. Electrical interconnects 64 are configured to electrically connect electrical couplings 24 of electronic device workpiece 20 with electrical couplings 45 of chuck 40. The depicted electrical interconnects 64 comprise double-ended probes or pogo pins which are also available from Rika Denshi America, Inc. and have product designation B1052 Series Probes. Other suitable probes include B1080-C3 Low Profile Probes and the B1303-C3 or B1316-C3 Ball Grid Probes. Electrical interconnects 64 of other configurations can be utilized.

The depicted intermediate member includes a lip 63 configured to receive electronic device workpiece 20. Chuck 40 includes lip 52 configured to receive intermediate member 60.

In the depicted embodiment, mechanical devices such as clamps can be utilized to couple or maintain electronic device workpiece 20 with surface 61 of intermediate member 60. Further, a vacuum is utilized in the illustrated embodiment to couple intermediate member 60 with chuck 40. The depicted chuck 40 includes plural chuck vacuum channels or chambers 49. Vacuum channels 49 are in fluid communication with openings 53 at surface 41 of chuck 40. Vacuum channels or chambers 49 are configured to couple with a vacuum source 51 and receive a vacuum to couple intermediate member 60 relative to chuck 40. In other embodiments, intermediate member 60 is received and maintained within chuck 40 by mechanical fasteners such as clamps. In addition, a vacuum can be utilized in other arrangements to couple workpiece 20 with intermediate member 60.

An alternative configuration of intermediate member 60 includes utilization of a copper filmipolyamide tape having conductive microbumps to provide electrical connection of sensors 23 and electrical couplings 45 of chuck 40. An exemplary tape is available from Nitto Denko America, Inc.

Referring to FIGS. 3 and 4, the depicted chuck 40 includes a plurality of electrical couplings 45. Electrical couplings 45 are embodied as pogo plugs 47 in the presently described embodiment. The depicted pogo plugs 47 individually include an insulator 50 provided about conductive electrical coupling 45. Exemplary materials of insulator 50 include plastic, glass, ceramic, Teflon, and Torlon. Pogo plugs 47 can be provided within a plurality of vias 48 formed within chuck 40. Wires 13 are connected with electrical couplings 45 of pogo plugs 47 and data gathering device 14.

Figure 5:
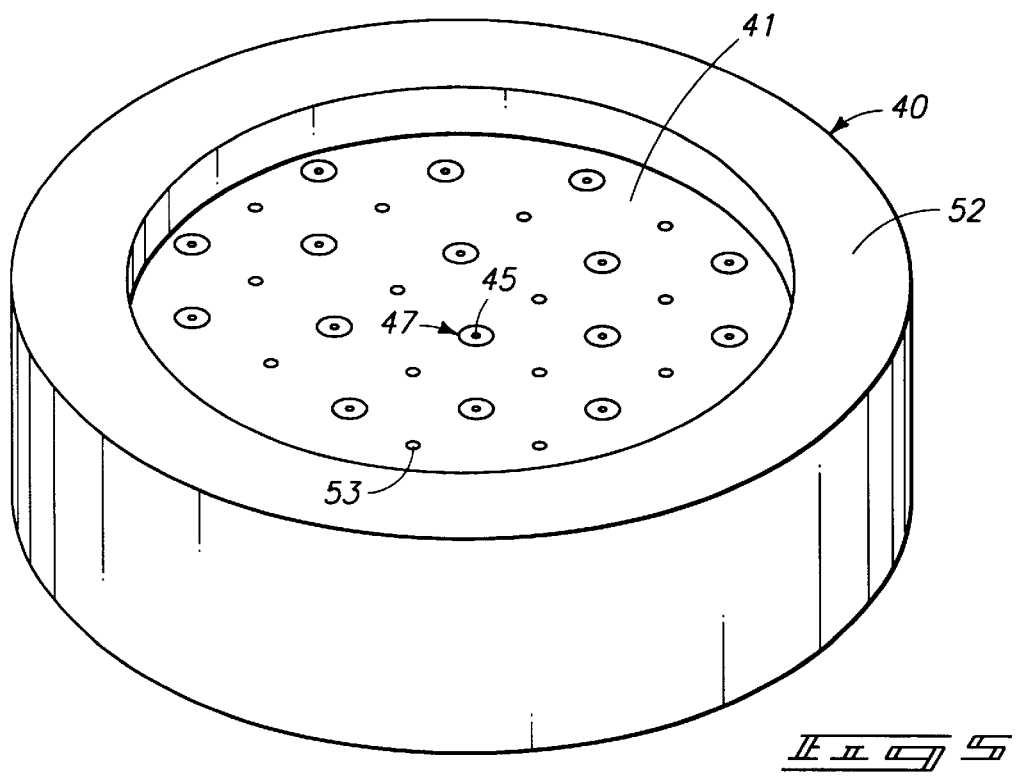
FIG. 5 is an isometric view of the chuck depicted in FIG. 3.

Referring to FIG. 5, details of chuck 40 are illustrated. Electrical couplings 45 are shown adjacent surface 41 of chuck 40. Insulators 50 of pogo plugs 47 are shown to isolate conductive electrical couplings 45 from chuck 40. In addition, openings 53 of vacuum channels or chambers 49 are visible within surface 41. Lip 52 surrounds the periphery of chuck 40 in the illustrated embodiment and is configured to receive intermediate member 60 as previously described.

Referring again to FIG. 3, reception of electronic device workpiece 20 upon surface 61 of intermediate member 60 slightly depresses electrical couplings 65 of pogo pins 64 establishing an electrical connection intermediate electrical couplings 24, 65. Similarly, placement of intermediate member 60 within chuck 40 slightly depresses electrical couplings 66 of pogo pins 64 establishing electrical conduction intermediate electrical couplings 45, 66.

In the described embodiment, intermediate member 60 is configured to temporarily receive electronic device workpiece 20. Following processing of electronic device workpiece 20, workpiece 20 can be removed from intermediate member 60. Also, chuck 40 is configured to temporarily receive intermediate member 60 in the described embodiment. Following production or processing of electronic device workpieces 20, intermediate member 60 can be removed from chuck 40.

One advantage of the embodiment described with reference to FIG. 3, is the provision of a clean production chuck 40 having no moving parts. In addition, chuck 40 is isolated to a greater extent from the processing environment utilized to fabricate or process electronic device workpieces 20. Utilization of intermediate member 60 provides processing of electronic device workpiece 20 apart from chuck 40. Such minimizes exposure of chuck 40 to processing materials utilized during fabrication processes.

According to one processing methodology, calibration workpiece 20 is received within intermediate member 60, and intermediate member 60 placed upon chuck 40. Following sensing of process conditions using sensors 23, calibration workpiece 20 is removed from intermediate member 60. Thereafter, production electronic device workpieces are individually placed within intermediate member 60 and processing of such workpieces occurs in mass.

Figure 6:
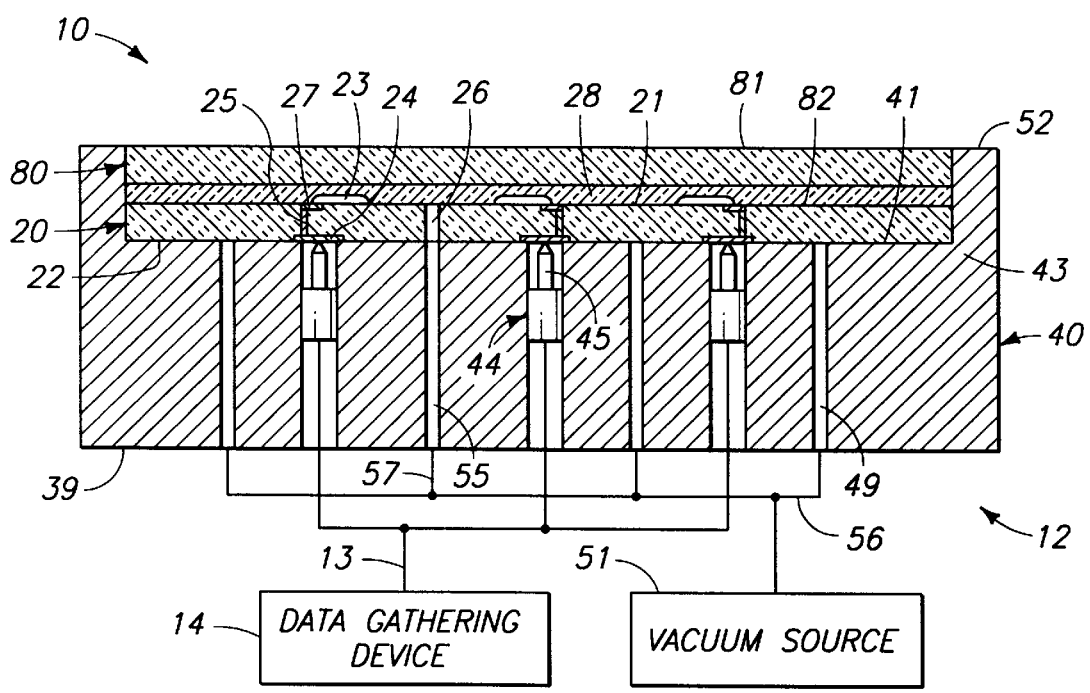
FIG. 6 is a cross-sectional view of another embodiment of an electronic device workpiece processing apparatus.

Referring to FIG. 6, another embodiment of an electronic workpiece processing apparatus 10 according to the present invention is illustrated. Workpiece holder 12 depicted in FIG. 6 comprises a chuck 40 configured to receive plural electronic device workpieces. In particular, chuck 40 is configured to receive a calibration workpiece 20 and a production workpiece 80. Lip 52 of chuck 40 has been vertically extended in the embodiment illustrated in FIG. 6 to accommodate reception of plural electronic device workpieces. Utilization of the configuration of apparatus 10 of FIG. 6 enables processing of production workpieces 80 while monitoring processing conditions using calibration workpiece 20.

Calibration workpiece 20 includes plural sensors 23 and corresponding connections 25, 27 and electrical coupling 24 although only one construction is labelled as such in FIG. 6. The calibration workpiece 20 illustrated in FIG. 6 additionally includes plural through holes or vacuum chambers 26 passing intermediate surfaces 21, 22. Plural through holes 26 are preferably provided within calibration workpiece 20 although only one such through hole is illustrated in FIG. 6.

The depicted chuck 40 comprises plural vacuum channels or chambers 49, 55 intermediate surfaces 39, 41 of chuck 40. Vacuum channels or chambers 49 allow application of a vacuum to calibration workpiece 20 which pulls calibration workpiece 20 toward chuck 40. Vacuum chambers 55 and through holes 26 permit application of a vacuum to production workpiece 80 which pulls production workpiece 80 toward calibration workpiece 20 and chuck 40.

In particular, vacuum channels or chambers 49, 55 are configured to couple with an external vacuum source 51 at positions adjacent surface 39 of chuck 40. Vacuum source 51 is configured to provide a calibration wafer hold-down vacuum to chamber 54 using a supply line 56. In addition, the illustrated vacuum source 51 is configured to provide a production wafer hold-down vacuum to vacuum channel or chambers 26, 55 and production wafer 80 via connection 57. As illustrated, through holes 26 of calibration wafer 20 are configured to align with vacuum chambers 55 of chuck 40. Application of hold-down vacuums to channels or chambers 26, 49, 55 operate to couple the respective calibration workpiece 20 and production workpiece 80 with chuck 40.

In an alternative embodiment, mechanical devices are utilized to couple calibration workpiece 20 and production workpiece 80 with chuck 40.

The depicted chuck 40 includes an electrical interconnect 44 and an electrical coupling 45 configured to meet or couple with electrical coupling 24 of calibration workpiece 20. In the depicted arrangement, electrical interconnect 44 comprises a pogo pin. Wire connection 13 operates to couple electrical interconnect 44 with data gathering device 14. In the depicted embodiment, electrical interconnect 44 comprises circuitry configured to conduct process signals within chuck 40 and intermediate surfaces 39, 41. Data gathering device 14 is configured to receive the process signals from sensors 23 through chuck 40 and intermediate member 60.

Figure 7:
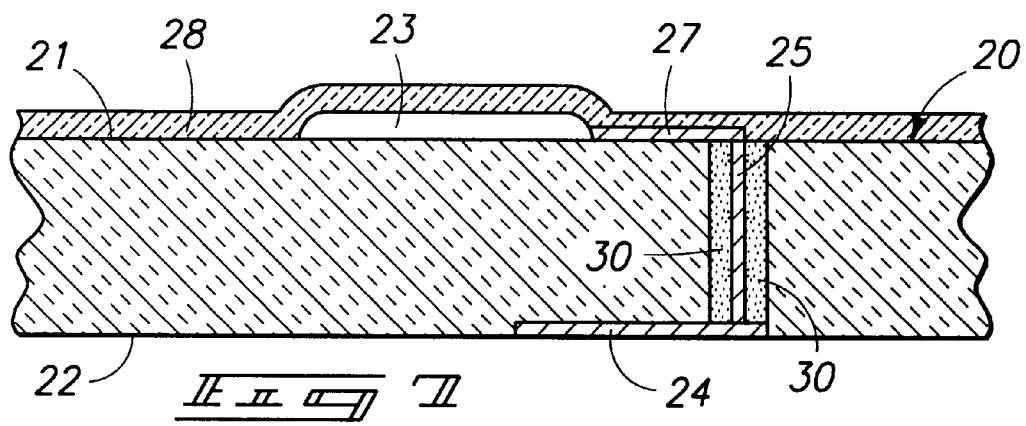
FIG. 7 is a cross-sectional view of a sensor configuration of an electronic device workpiece.

Referring to FIG. 7, an exemplary portion of a calibration workpiece 20 is illustrated. Sensor 23 comprising a resistance temperature device is shown provided upon surface 21 of calibration workpiece 20. Via 25 is formed within calibration workpiece 20 intermediate surfaces 21, 22. Via 25 is conductive to permit communication of process signals. Electrical connection 27 is illustrated connecting sensor 23 and via 25. In the depicted embodiment, electrical connection 27 comprises a conductive trace.

An insulative dielectric layer 30 is provided about via conductor 25 in some configurations. Provision of dielectric layer 30 is preferred if workpiece 20 is semiconductive or conductive. Layer 30 is typically not utilized if workpiece 20 comprises a non-conductive material, such as glass.

In the preferred embodiment, a conformal protection layer 28 is provided over surface 21, sensor 23 and connection 27. Layer 28 operates to protect surface 21, sensor 23 and electrical connection 27 from the processing environment including gasses, chemicals, plasmas, etc. utilized during processing of the electronic device workpieces. In the described embodiment, layer 28 comprises glass. The glass may be sputtered over calibration workpiece 20 including sensors 23, electrical connections 27 and surface 21.

Figure 8:
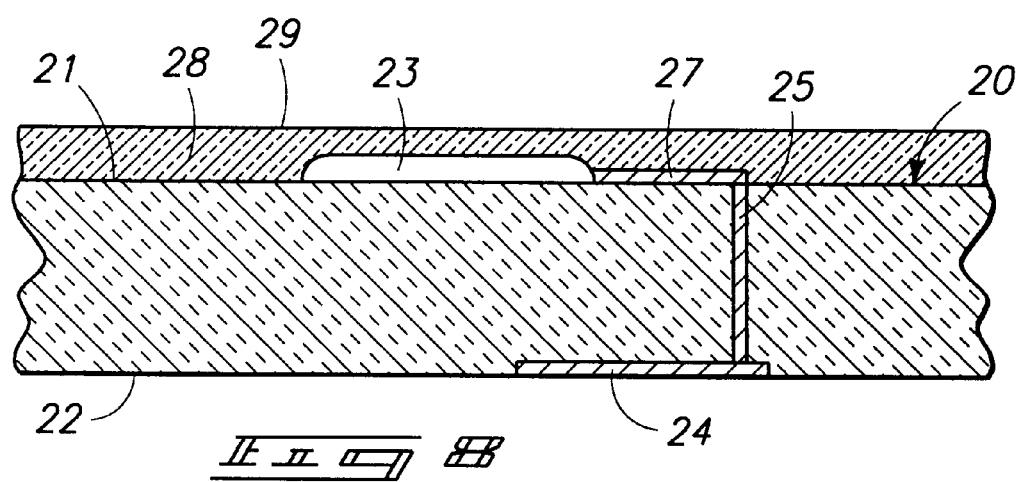
FIG. 8 is a cross-sectional view of another sensor configuration of an electronic device workpiece.

Referring to FIG. 8, a thick protection layer 28 is shown provided over sensors 23 and electrical connection 27. Layer 28 is preferably chemically or mechanically polished providing a flat or smooth surface 29 of layer 28. A polished or flat smooth surface 29 of layer 28 facilitates vacuum sealing of a production workpiece 80 placed over calibration workpiece 20. In addition, flat smooth surface 29 provides enhanced wearing properties during processing of production workpieces 80 or exposure of calibration workpiece 20 to process conditions. A worn or damaged glass layer 28 may be reprocessed to add more glass or resurfaced to remove defects within the existing glass layer.

Figure 9:
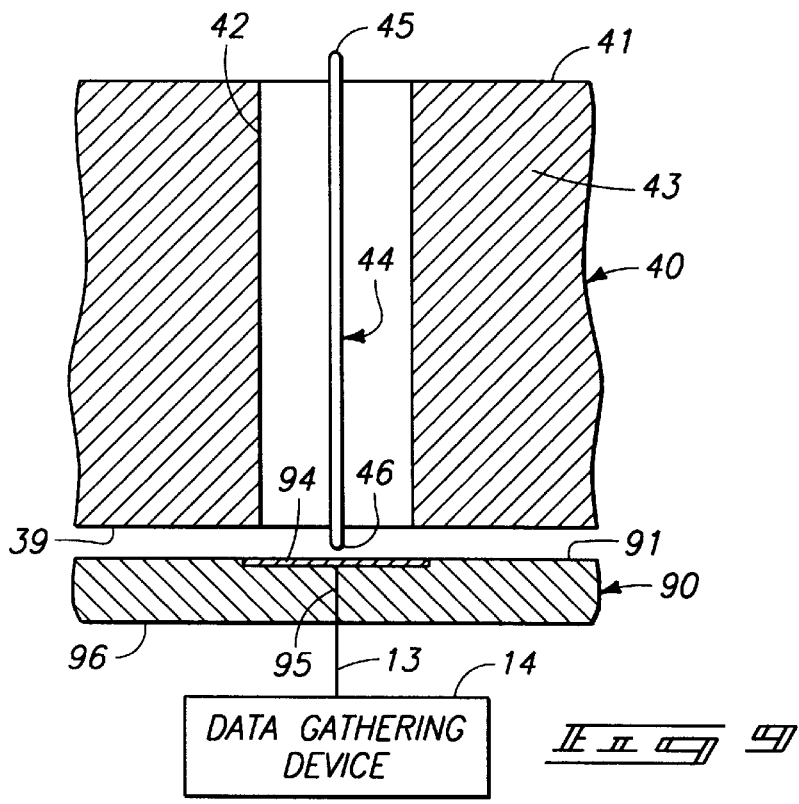
FIG. 9 is a cross-sectional view of one embodiment of an electrical interconnect within a chuck of an electronic device workpiece processing apparatus.

Referring to FIG. 9, a portion of another embodiment of chuck 40 configured to receive a calibration workpiece (not illustrated in FIG. 9) is depicted. Through hole 42 is shown passing intermediate surfaces 39, 41 of chuck 40. Plural through holes 42 are preferably provided in chuck 40 although only one such through hole is illustrated in FIG. 9. An insulative layer (not illustrated in FIG. 9) is preferably provided if chuck 40 comprises a conductive material. In particular, an insulative layer can be provided about interconnect 44 or along the surface of through hole 42 to electrically isolate interconnect 44 from chuck 40. Such an insulative layer is not typically utilized if chuck 40 is non-conductive.

Electrical interconnect 44 comprises a conductive column or wire in the embodiment depicted in FIG. 9. In particular, the depicted electrical interconnect 44 comprises a buckle beam or column wire contact. Electrical interconnect 44 is provided within through hole or via 42. Electrical interconnect 44 includes electrical couplings 45, 46 which are configured to extend outward from respective surfaces 39, 41 of chuck 40 as shown. Column electrical interconnect 44 is configured to provide electrical coupling with sensors 23.

A contact plate 90 is shown adjacent chuck 40 in FIG. 9. Contact plate 90 includes circuitry 95 configured to provide electrical connection with electrical couplings 46 of chuck 40. Contact plate 90 includes a land pad or electrical coupling 94 configured for electrical connection with electrical coupling 46 of column interconnect 44. Electrical contact plate 90 can comprise a printed circuit board (PCB), ceramic thick/thin film circuit board in exemplary embodiments. Circuitry 95 provides electrical connection intermediate surfaces 91, 96 of contact plate 90. Circuitry 95 is coupled with connection 13 and data gathering device 14.

Figure 10:
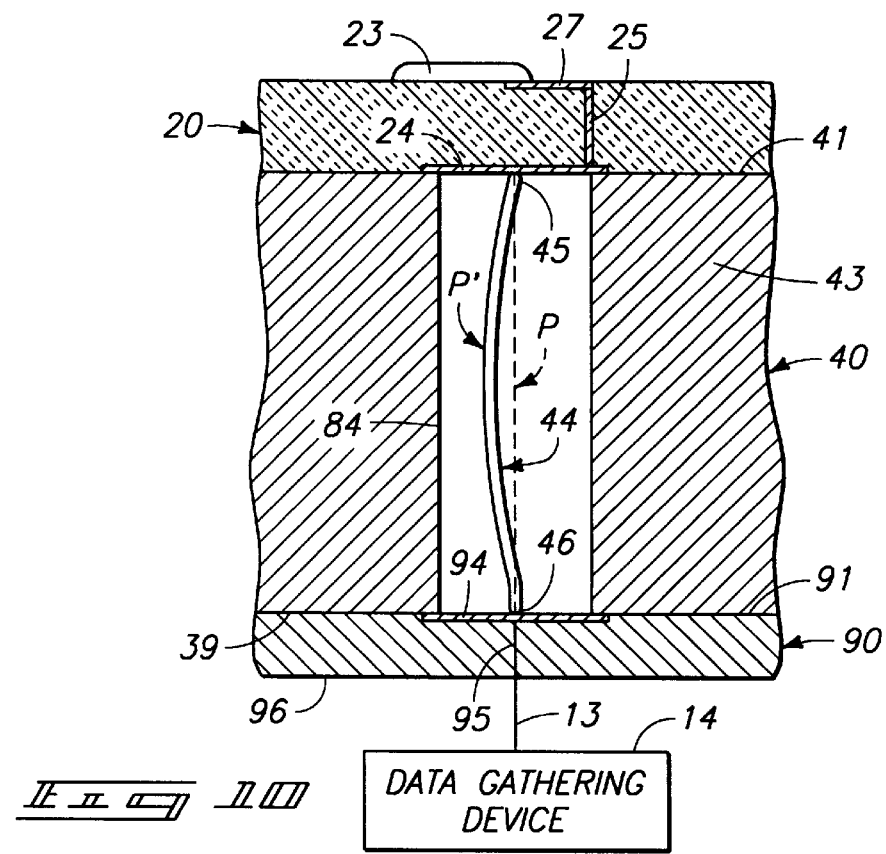

Referring to FIG. 10, an electronic device workpiece comprising a calibration wafer 20 is shown contacting surface 41 of chuck 40. In addition, chuck 40 is shown contacting contact plate 90. As illustrated, placement of calibration workpiece 20 upon chuck 40 and chuck 40 upon plate 90 deflects conductive column 44. In particular, the original position P of conductive column 44 is represented by a dashed line in FIG. 10. Placement of calibration workpiece 20 upon chuck 40 and chuck 40 upon contact plate 90 results in deflection of conductive column 44 to the illustrated position P' in FIG. 10.

In the illustration of FIG. 10, electrical couplings 45, 46 are provided in a conductive relationship with respective electrical couplings 24, 94 of calibration workpiece 20 and contact plate 90 respectively. Through hole 84 is preferably sized to provide electrical isolation of conductive column interconnect 44 from chuck 40 when conductive column 44 is deflected as shown in FIG. 10. In particular, chuck 40 can comprise a material 43 which is conductive in some embodiments. Spacing conductive column 44 from material 43 of chuck 40 provides electrical insulation or isolation of process signals passing through conductive column electrical interconnect 44 from chuck 40.

In another embodiment, conductive wire interconnect 44 is fixed via electrical coupling 46 to electrical coupling 94 of contact plate 90. Electrical coupling 45 of conductive column 44 can thereafter be free to couple with electrical coupling 24 of calibration workpiece 20.

Referring to FIG. 11, another configuration having conductive column 44 fixed to chuck 40 at an intermediate location of through hole 84 is illustrated. Both ends of conductive column 44 comprise respective electrical couplings 45, 46 configured to move or deflect responsive to coupling with external pads or electrical couplings. In the depicted embodiment, a securing device 88 is formed within through hole 84 to fix conductive column 44 at the approximately middle portion of through hole 84. In exemplary embodiments, securing device 88 comprises epoxy press fit as a disk or plug into through hole 84. In another embodiment, through hole 84 is filled with epoxy which is subsequently machined to form securing device 88. Securing device 88 is preferably non-conductive if chuck 40 comprises a conductive material.

Referring to FIG. 12, an alternative configuration is shown providing an encapsulated conductive column wire 44 within through hole 84. An electrically insulating encapsulating material 97, such as an elastomer, can be utilized to encapsulate conductive column 44. Such is preferred wherein chuck 40 comprises a conductive material 43. Encapsulation of conductive column interconnect 44 is utilized to hold conductive column wire 44 within through hole 84 and isolate conductive column 44 from chuck 40. Utilization of an encapsulating material 97 encloses through hole 84 of chuck 40 thereby reducing exposure of chuck 40 to contaminating materials present during processing of electronic device workpieces by apparatus 10.

Other electrical connections can be utilized within chuck 40 and intermediate member 60 of electronic workpiece device processing apparatus 10 in other embodiments. Exemplary connections include Short Contact™ connections available from Johnstech International Corporation and conventional socket type contacts (e.g., spring fingers). Other useable contacts include coil spring, leaf spring and probe needle type contacts and contacts available from Interconnect Devices, Inc. Microspring™ contacts available from FormFactor, Inc. may also be utilized. Other exemplary contacts or pins are described in U.S. Pat. No. 5,495,667, incorporated herein by reference. Further, pins can be placed upon land pads of an electronic device workpiece and configured for mating receipt within sockets provided upon chuck 40 or intermediate member 60 of apparatus 10.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of communicating signals within an electronic device workpiece processing apparatus, the method comprising:

providing a workpiece holder;

providing an electronic device workpiece including a sensor;

electrically coupling the sensor of the electronic device workpiece with the workpiece holder;

sensing a process condition using the sensor;

generating a signal using the sensor responsive to the sensing; and conducting the signal through the workpiece holder following the coupling.

2. The method according to claim 1, wherein the coupling comprises coupling circuitry of the electronic device workpiece with circuitry of the workpiece holder.

3. The method according to claim 1 further comprising breaking the coupling of the sensor and the workpiece holder.

4. The method according to claim 1 further comprising receiving the electronic device workpiece within the workpiece holder.

5. The method according to claim 1 wherein the coupling comprises coupling using an intermediate member.

6. The method according to claim 1 wherein the providing a workpiece holder comprises providing a chuck configured to receive an electronic device workpiece.

7. The method according to claim 1 wherein the sensing comprises sensing the process condition comprising temperature.

8. The method according to claim 1 wherein the sensing comprises sensing the process condition of the electronic device workpiece.

9. The method according to claim 1 further comprising supporting the electronic device workpiece using the workpiece holder.

10. The method according to claim 1 wherein the sensing comprises sensing the process condition regarding processing of electronic device workpieces within the electronic device workpiece processing apparatus.

11. The method according to claim 1 wherein the sensing comprises sensing the process condition at a location immediately adjacent the electronic device workpiece within the electronic device workpiece processing apparatus.

* * * * *

UNITED STATES PATENT AND TRADEMARK OFFICE
CERTIFICATE OF CORRECTION

PATENT NO. : 6,229,322 B1
DATED : May 8, 2001
INVENTOR(S) : David R. Hembree

Page 1 of 1

It is certified that error appears in the above-identified patent and that said Letters Patent is hereby corrected as shown below:

Column 3,
Line 24, please correct as follows: -- "Fig. 10 is a cross-sectional view of the electrical interconnect of Fig. 9 coupled with a calibration workpiece." --

Column 6,
Line 57, replace ""filmipolyamide"" with -- "film/polyamide" --.

Signed and Sealed this

Thirteenth Day of November, 2001

Attest:

NICHOLAS P. GODICI
Attesting Officer
Acting Director of the United States Patent and Trademark Office